(12) United States Patent
Nozawa et al.

(10) Patent No.: US 7,770,714 B2
(45) Date of Patent: Aug. 10, 2010

(54) TRANSFER APPARATUS

(75) Inventors: Naoyuki Nozawa, Inagi (JP); Hiroshi Sone, Sagamihara (JP); Satoshi Hitomi, Fuchu (JP); Yoshiro Hasegawa, Tama (JP)

(73) Assignee: Canon Anelva Corporation, Kawasaki-shi (JP)

( * ) Notice: Subject to any disclaimer, the term of this patent is extended or adjusted under 35 U.S.C. 154(b) by 153 days.

(21) Appl. No.: 12/194,951

(22) Filed: Aug. 20, 2008

(65) Prior Publication Data
US 2009/0056878 A1    Mar. 5, 2009

(30) Foreign Application Priority Data

| Aug. 27, 2007 | (JP) | ............................. 2007-219564 |
| Aug. 27, 2007 | (JP) | ............................. 2007-219565 |

(51) Int. Cl.
    *B65G 35/00* (2006.01)
(52) U.S. Cl. ................... 198/619; 414/217; 118/719
(58) Field of Classification Search ............... 198/619; 414/217; 118/715, 719
    See application file for complete search history.

(56) References Cited

U.S. PATENT DOCUMENTS

| 5,133,285 | A | * | 7/1992 | Mahler et al. ............... 118/719 |
| 5,377,816 | A | * | 1/1995 | Deligi et al. ................ 198/619 |
| 5,647,477 | A | | 7/1997 | Morishita .................... 198/619 |
| 5,881,649 | A | | 3/1999 | Hasegawa et al. ............ 104/167 |
| 5,906,262 | A | | 5/1999 | Miki ......................... 98/341.02 |
| 5,909,995 | A | | 6/1999 | Wolf et al. .................. 414/217 |
| 6,183,831 | B1 | | 2/2001 | Hughes et al. ............. 428/65.3 |
| 6,402,118 | B1 | | 6/2002 | Nijsse et al. ................ 248/550 |
| 6,517,961 | B1 | | 2/2003 | Agata et al. ................ 428/702 |
| 6,561,343 | B2 | | 5/2003 | Miyauchi et al. ............ 198/619 |
| 6,919,001 | B2 | | 7/2005 | Fairbairn et al. ....... 204/298.25 |
| 7,575,406 | B2 | * | 8/2009 | Hofmeister et al. ......... 414/217 |
| 7,597,186 | B2 | * | 10/2009 | Chung et al. ................ 198/619 |
| 2002/0144881 | A1 | | 10/2002 | Miyauchi et al. ............ 198/619 |
| 2008/0039331 | A1 | | 2/2008 | Okazaki et al. ............. 505/166 |

FOREIGN PATENT DOCUMENTS

| JP | 2-52829 | 4/1990 |
| JP | 2-528293 | 4/1990 |
| JP | 05-097242 | 4/1993 |

(Continued)

OTHER PUBLICATIONS

Japanese Office Action dated May 19, 2009, in related corresponding Japanese Patent Appln. No. 2007-219565.

(Continued)

*Primary Examiner*—James R Bidwell
(74) *Attorney, Agent, or Firm*—Fitzpatrick, Cella, Harper & Scinto

(57) ABSTRACT

A transfer apparatus includes a first magnetic member placed in a carrier, and a second magnetic member placed in a carrier supporting unit to oppose the first magnetic member from a position below the first magnetic member in the vertical direction, and having the same polarity as that of the first magnetic member. The repulsive force generated between the first and second magnetic members vertically pushes up the carrier, thereby reducing the weight of the carrier supported by the carrier supporting unit.

16 Claims, 9 Drawing Sheets

FOREIGN PATENT DOCUMENTS

| | | |
|---|---|---|
| JP | 06-192833 | 7/1994 |
| JP | 7-243037 | 9/1995 |
| JP | 8-76594 | 3/1996 |
| JP | 8-85625 | 4/1996 |
| JP | 10-120171 | 5/1998 |
| JP | 10-159934 | 6/1998 |
| JP | 10-205604 | 8/1998 |
| JP | 11-317438 | 11/1999 |
| JP | 2001-206548 | 7/2001 |
| JP | 2001-518598 | 10/2001 |
| JP | 2002-68476 | 3/2002 |
| JP | 2005-150606 | 6/2005 |
| JP | 2005-163863 | 6/2005 |
| JP | 2005-289556 | 10/2005 |
| JP | 2006-517324 | 7/2006 |
| JP | 2006-204085 | 8/2006 |
| JP | 2007-84338 | 4/2007 |

OTHER PUBLICATIONS

Japanese Office Action dated Jun. 9, 2009, in related corresponding Japanese Patent Appln. No. 2007-219564.

* cited by examiner

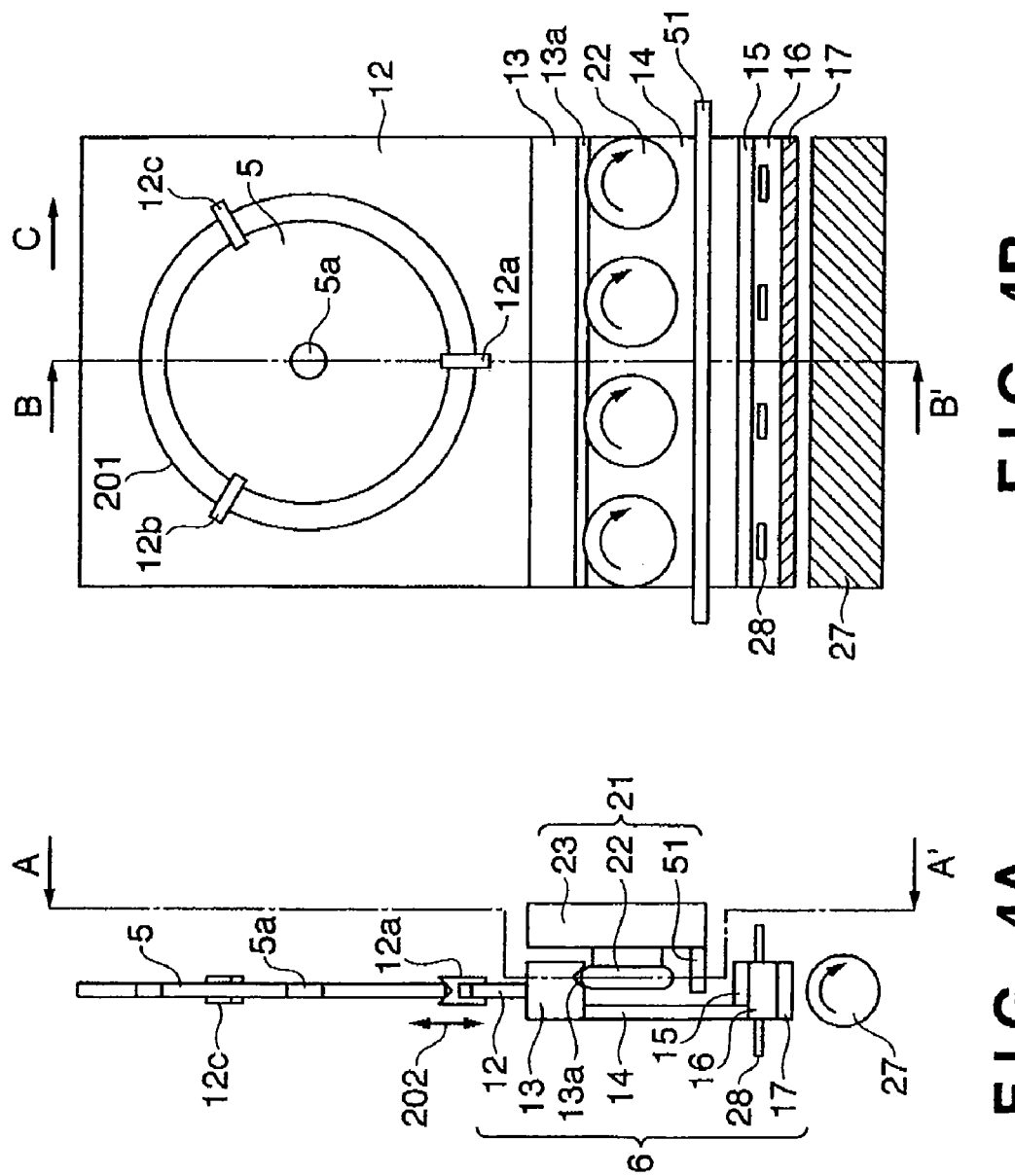

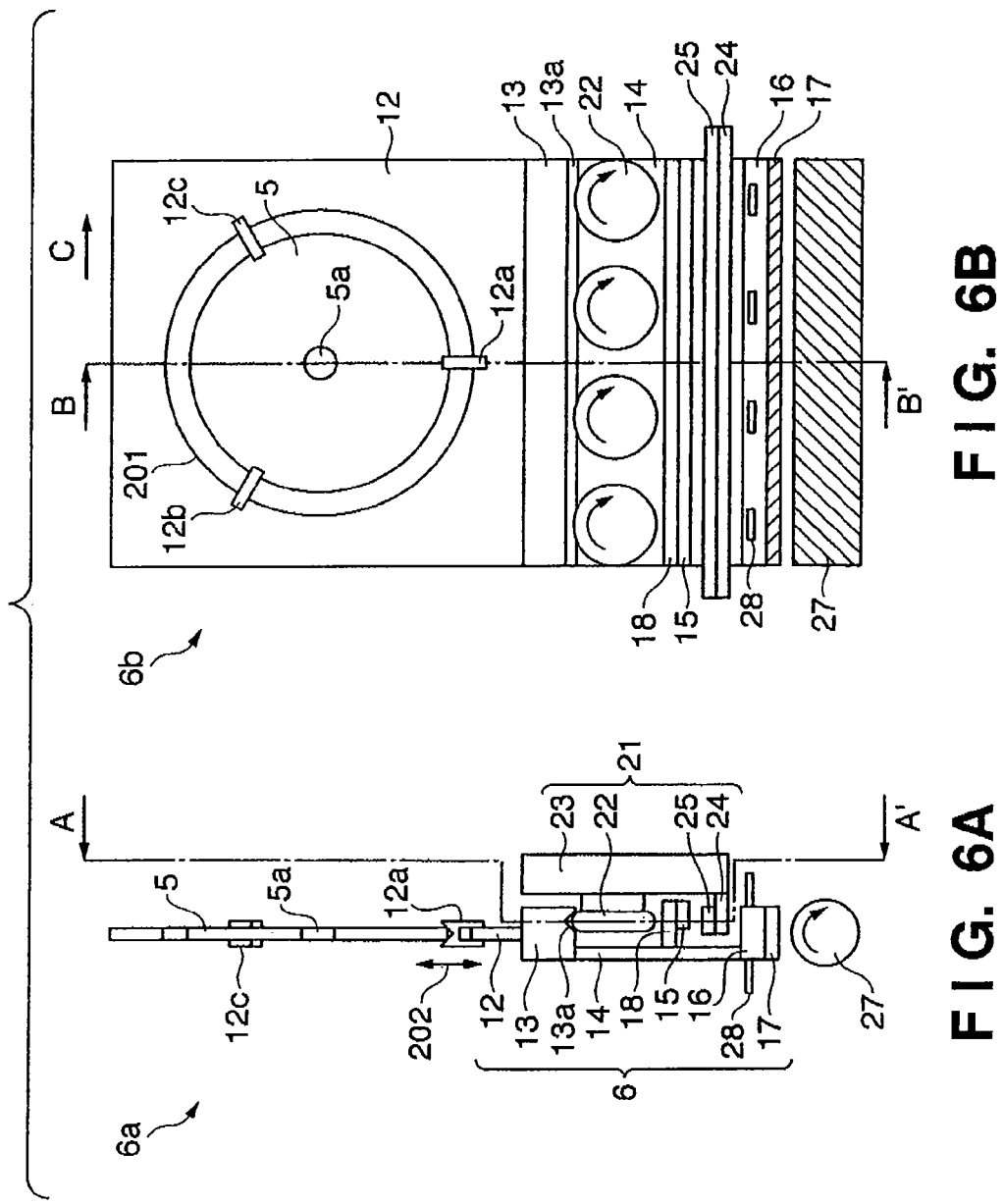

TRANSFER APPARATUS

BACKGROUND OF THE INVENTION

1. Field of the Invention

The present invention relates to a substrate transfer apparatus used to support and transfer a substrate in, e.g., a substrate processing apparatus for performing predetermined processing on the surface of the substrate.

2. Description of the Related Art

When performing processing such as film formation or etching while a substrate is transferred in a vacuum environment, a rack and pinion mechanism, roller driving mechanism, chain driving mechanism, or the like is conventionally used as a substrate transfer apparatus in many cases. Also, Japanese Patent Laid-Open No. 2002-68476 has disclosed a transfer apparatus using a magnetic force.

FIGS. 9A and 9B are views exemplarily showing an example of the arrangement of the main components of the transfer apparatus using a magnetic force. FIG. 9A is a B-B' sectional view of FIG. 9B. FIG. 9B is an A-A' sectional view of FIG. 9A. Note that some members such as a vacuum chamber are not illustrated for convenience.

In the arrangement shown in FIGS. 9A and 9B, a carrier 6 holds a substrate 5 upright so that the major surface is parallel to the vertical direction. The transfer apparatus horizontally transfers the carrier 6 parallel to the major surface of the substrate 5. The carrier 6 has a guide rail portion 13 having a rectangular or curved groove 13a. A carrier supporting means 21 fixed to a vacuum chamber (not shown) has a plurality of guide rollers 22. In this arrangement, the guide rollers 22 are fitted in the groove 13a of the guide rail portion 13, and the carrier 6 horizontally moves on the rotating guide rollers 22.

In the example shown in FIGS. 9A and 9B, the transfer apparatus has a magnet group 17 as a means for transferring the carrier 6. The magnet group 17 is formed by alternately arranging S- and N-pole magnets in the transfer direction at the lower end of the carrier 6. A magnetic screw 27 is set in the vacuum chamber with a predetermined spacing from the magnet group 17. The central axis of the magnetic screw 27 is parallel to the transfer direction of the carrier 6. A double-spiral magnetic coupling portion including S- and N-pole spiral portions formed at the same pitch as that of the S- and N-pole magnets of the magnet group 17 is formed on the surface of the magnetic screw 27. When the magnetic screw 27 is rotated, the S- and N-pole spiral portions move in a portion corresponding to the magnet group 17 relative to the transfer direction of the carrier 6. Consequently, the carrier 6 is transferred in the direction of an arrow C by the attractive force between the S- and N-pole spiral portions and the N- and S-pole magnets of the magnet group 17.

In this conventional transfer apparatus as exemplarily shown in FIGS. 9A and 9B, particles are generated by the friction between the surface of the groove 13a of the guide rail portion 13 of the carrier 6 and the guide rollers 22 of the carrier supporting means 21. Contamination of the substrate 5 by the particles is a cause of a defective product. Also, the friction between the groove 13a and guide rollers 22 wears the guide rail portion 13 and guide rollers 22 and changes the height of the carrier 6. This makes it necessary to periodically perform maintenance to adjust the height of the carrier 6 and replace worn parts.

SUMMARY OF THE INVENTION

It is an object of the present invention to increase the product yield of the above-mentioned substrate transfer apparatus by suppressing the generation of particles by the friction between the carrier supporting means and carrier.

It is another object of the present invention to increase the productivity by decreasing the frequency of maintenance for adjusting the height of the carrier to compensate for wearing of the members of the carrier supporting means and carrier, and replacing worn parts.

According to one aspect of the present invention, there is provided a transfer apparatus including a carrier which supports a major surface of a substrate parallel to a transfer direction of the substrate, carrier supporting means fixed in a vacuum chamber to support a weight of the carrier such that the carrier is slidable in the transfer direction, and carrier transferring means for transferring the carrier in the transfer direction in the vacuum chamber, the transfer apparatus comprising: a first magnetic member placed in the carrier; and a second magnetic member placed in the carrier supporting means to oppose the first magnetic member from a position above the first magnetic member in the vertical direction, and having polarity opposite to that of the first magnetic member.

According to another aspect of the present invention, there is provided a transfer apparatus including a carrier which supports a major surface of a substrate parallel to a transfer direction of the substrate, carrier supporting means fixed in a vacuum chamber to support a weight of the carrier such that the carrier is slidable in the transfer direction, and carrier transferring means for transferring the carrier in the transfer direction in the vacuum chamber, the transfer apparatus comprising: a first magnetic member placed on an upper end portion of the carrier; and a second magnetic member placed on an inner surface of an upper wall of the vacuum chamber to oppose the first magnetic member from a position above the first magnetic member in the vertical direction, and having polarity opposite to that of the first magnetic member.

According to still another aspect of the present invention, there is provided a transfer apparatus including a carrier which supports a major surface of a substrate parallel to a transfer direction of the substrate, carrier supporting means fixed in a vacuum chamber to support a weight of the carrier such that the carrier is slidable in the transfer direction, and carrier transferring means for transferring the carrier in the transfer direction in the vacuum chamber, the transfer apparatus comprising: a first magnetic member placed in the carrier; and a second magnetic member placed in the carrier supporting means to oppose the first magnetic member from a position below the first magnetic member in the vertical direction, and having the same polarity as that of the first magnetic member.

According to yet another aspect of the present invention, there is provided a transfer apparatus including a carrier which supports a major surface of a substrate parallel to a transfer direction of the substrate, carrier supporting means fixed in a vacuum chamber to support a weight of the carrier such that the carrier is slidable in the transfer direction, and carrier transferring means for transferring the carrier in the transfer direction in the vacuum chamber, the transfer apparatus comprising: a first magnetic member placed on an upper end portion of the carrier; and a second magnetic member placed on an inner surface of an upper wall of the vacuum chamber to oppose the first magnetic member from a position below the first magnetic member in the vertical direction, and having the same polarity as that of the first magnetic member.

The present invention can reduce the weight of the carrier on the portion of the carrier supporting means which is in direct contact with the carrier, by the attractive force between magnets having opposite polarities or between a magnet and magnetic material plate having opposite polarities, thereby reducing friction and wearing in that portion. Accordingly, it is possible to increase the product yield by suppressing the generation of particles, and increase the productivity by decreasing the frequency of maintenance for adjusting the height of the carrier and replacing parts resulting from wearing.

Further features of the present invention will become apparent from the following description of exemplary embodiments with reference to the attached drawings.

BRIEF DESCRIPTION OF THE DRAWINGS

FIGS. 4A and 4B are views showing the arrangement of the major parts of a transfer apparatus according to the third embodiment of the present invention;

FIGS. 6A and 6B are views showing the arrangement of the major components of a transfer apparatus according to the fifth embodiment of the present invention;

DESCRIPTION OF THE EMBODIMENTS

A transfer apparatus of the present invention horizontally transfers a substrate in a vacuum chamber. This transfer apparatus has a carrier, carrier supporting means, and carrier transferring means, and is characterized by reducing the friction between the carrier supporting means and carrier by using the attractive force of magnets.

The transfer apparatus of the present invention is applied to, e.g., a vacuum processing apparatus for performing processing such as film formation on a substrate. As a vacuum processing apparatus to which the transfer apparatus of the present invention is applied, FIG. 1 exemplarily shows the arrangement of an in-line vacuum processing apparatus obtained by connecting processing chambers in series.

Figure 1:
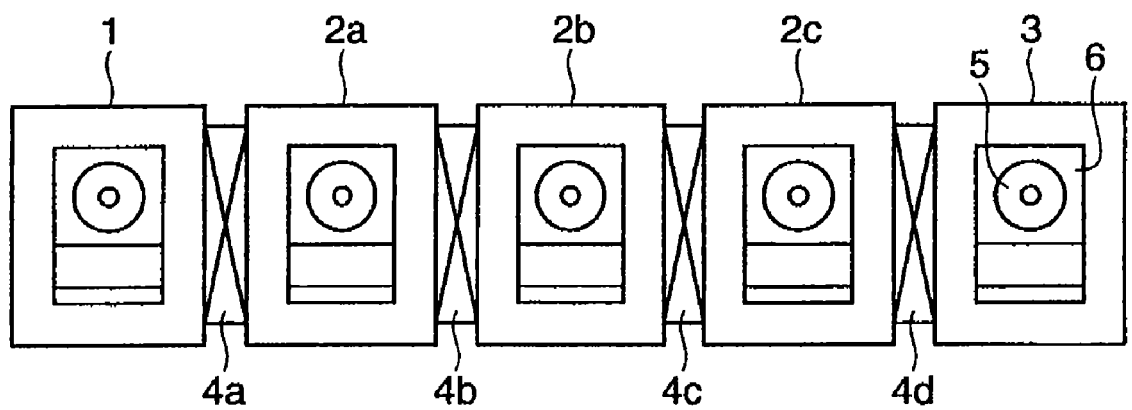
FIG. 1 is a view exemplarily showing the arrangement of an in-line vacuum processing apparatus to which a transfer apparatus of the present invention is applied.

In this in-line vacuum processing apparatus as shown in FIG. 1, a load lock chamber 1, processing chambers 2a to 2c, and an unload lock chamber 3 are connected via gate valves 4a to 4d. A carrier 6 supporting a substrate 5 is horizontally transferred by the rotation of a plurality of guide rollers (not shown) arranged in each chamber. Note that the number of processing chambers is three in FIG. 1, but the present invention is not limited to this number.

Referring to FIG. 1, a substrate loading means (not shown) places the substrate 5 transferred from the outside on the carrier 6 waiting in the load lock chamber 1. The carrier 6 supporting the substrate 5 is transferred to the processing chambers 2a to 2c in order, and undergoes desired processing. The carrier 6 is then transferred to the unload lock chamber 3. After that, a substrate unloading means (not shown) removes the substrate 5 from the carrier 6, unloads the substrate 5 outside the in-line vacuum processing apparatus, and supplies the substrate 5 to the next step. The carrier 6 from which the substrate 5 is removed is returned into the load lock chamber 1 through a return path (not shown), and waits until the next substrate is loaded.

First Embodiment

Figure 2B:
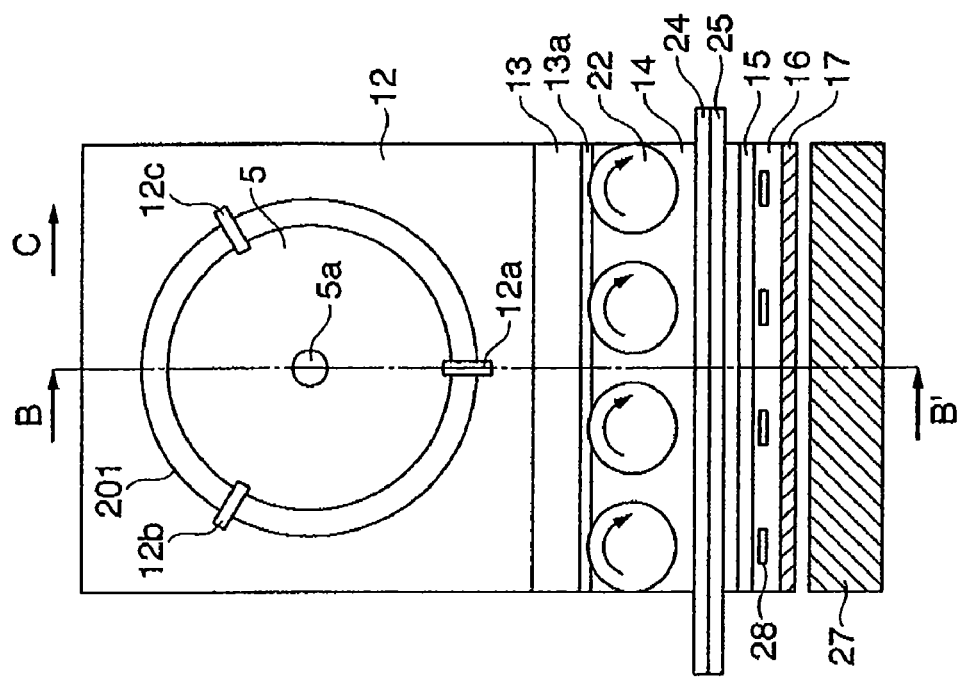
FIGS. 2A and 2B are views showing the arrangement of the main parts of a transfer apparatus according to the first embodiment of the present invention.
Figure 2A:
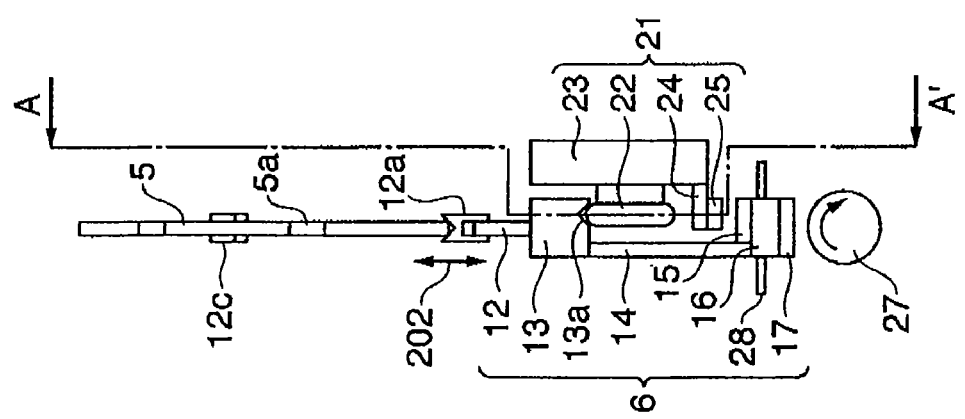

FIGS. 2A and 2B are views exemplarily showing the arrangement of the major parts of a transfer apparatus according to the first embodiment of the present invention. FIG. 2A is a B-B' sectional view of FIG. 2B. FIG. 2B is an A-A' sectional view of FIG. 2A. Note that some members such as a vacuum chamber are not illustrated for convenience.

Figure 9B:
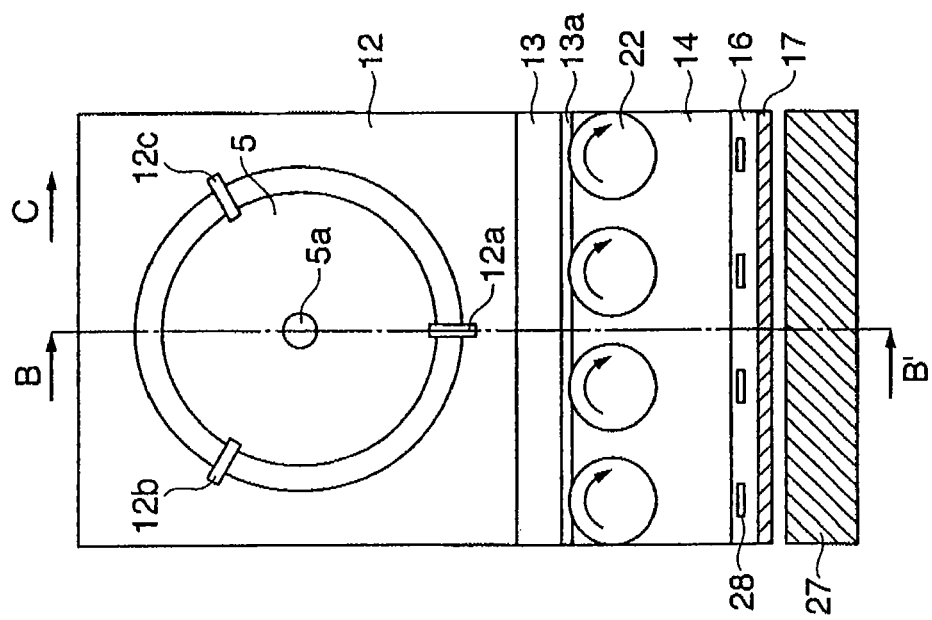
FIGS. 9A and 9B are exemplary views showing the arrangement of the main parts of an example of a conventional transfer apparatus.
Figure 9A:
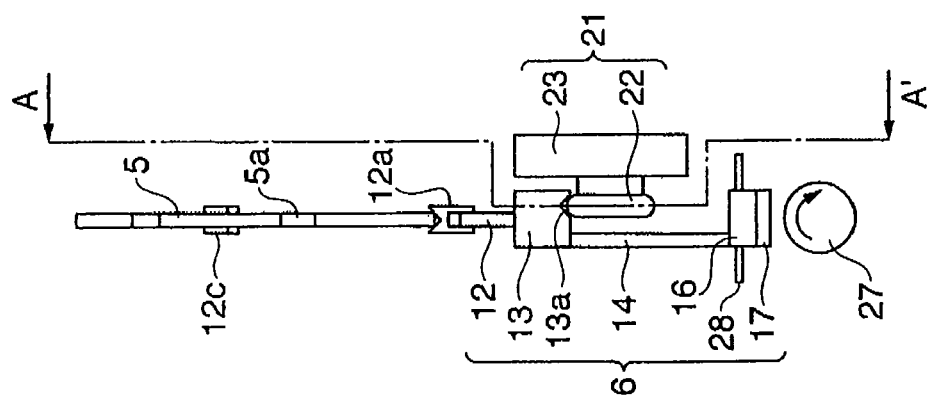

The basic structure of the transfer apparatus of the first embodiment is the same as that of the transfer apparatus shown in FIGS. 9A and 9B, except that a first magnet 15 is attached to a carrier 6 and a second magnetic 25 is attached to a carrier supporting means 21. Details will be explained below.

The carrier 6 has a holder portion 12, a guide rail portion 13 having a rectangular or curved groove 13a, a magnetic yoke 16, a connecting portion 14 for connecting the guide rail portion 13 and magnetic yoke 16, the first magnet 15, and a magnet group 17 on the carrier side.

The holder portion 12 has a central opening 201 having an inner periphery larger than the substrate 5. Clamps 12a, 12b, and 12c hold the substrate 5 upright such that the major surface (surface) of the substrate 5 is parallel to the vertical direction. The clamp 12a has a spring (not shown) in a support portion between the clamp 12a and holder portion 12, and can vertically move in the direction of an arrow 202. When holding the substrate 5 in the holder portion 12, the clamp 12a is pushed down, and a robot arm temporarily sets the substrate 5 so as to urge the outer periphery of the substrate 5 against grooves of the clamps 12b and 12c. Then, the clamp 12a is released, and a groove of the clamp 12a biases the outer periphery of the substrate 5 upward by the upward spring force. The substrate 5 is fixed to the holder portion 12 as the clamps 12a, 12b, and 12c clamp the substrate 5. An arm of an automatic loader transfers the substrate 5 by hooking an opening 5a formed in the center of the substrate 5.

The carrier supporting means 21 has a plurality of guide rollers 22, a base portion 23 to which the plurality of guide rollers 22 are fixed, and a magnetic yoke 24 attached to the lower end of the base portion 23. The magnetic yoke 24 vertically opposes the magnetic yoke 16 attached to the carrier 6. In this opposing portion, the first magnet 15 is placed on the magnetic yoke 16 so as to vertically face up. The second magnet 25 is placed on the magnetic yoke 24 opposing the magnetic yoke 16, so as to vertically face down with a desired spacing from the first magnet 15.

The plurality of guide rollers 22 are arranged straight at predetermined intervals on the base portion 23 in the transfer direction (the direction of an arrow C) of the carrier 6. The plurality of guide rollers 22 are arranged such that the groove 13a of the guide rail portion 13 is fitted on the guide rollers 22, thereby supporting the weight of the carrier 6. Since the guide rail portion 13 and guide rollers 22 are not fixed, the carrier 6 can horizontally slide parallel to the major surface of the substrate 5 when the guide rollers 22 rotate.

The base portion 23 is fixed to the inner wall of a vacuum chamber (not shown) via a stay member (not shown).

In this embodiment, the magnetic yoke 24 made of a magnetic material is placed on the substrate side of the second magnet 25 closer to the substrate 5 than the first magnet 15. The magnetic yoke 24 fixes the magnet 25, and also suppresses the leakage of the magnetic field from the magnet 25 to the back side (the side on which the magnet 25 and magnetic yoke 24 are in contact), thereby vertically forming a stable magnetic field downward from the magnet 25. In addition, the magnetic yoke 24 makes it possible to prevent the magnetic fields of the first and second magnets 15 and 25 from influencing a plasma space around the substrate 5, and suppress the influence of thermal radiation from the plasma space. The magnetic yoke 16 fixes the first magnet 15, and also suppresses the leakage of the magnetic field from the magnet 15 to the back side (the side on which the magnet 15 and magnetic yoke 16 are in contact), thereby vertically forming a stable magnetic field upward from the magnet 15. In addition, on the side away from the first magnet 15, the magnetic yoke 16 fixes the magnet group 17, and also suppresses the leakage of the magnetic field from the magnet group 17 to the side on which the magnet group 17 and magnetic yoke 16 are in contact, thereby vertically forming a stable magnetic field downward.

In this embodiment, in order to stably transfer the carrier 6 while standing upright, horizontal guide rollers 28 are arranged so as to sandwich the magnetic yoke 16 below the carrier 6. The guide rollers 28 are fixed to the inner wall of the vacuum chamber (not shown) by using a stay member (not shown) or the like.

In this embodiment, the magnet group 17 attached to the carrier 6 and the magnetic screw 27 are used as the carrier transferring means. In the magnet group 17, N- and S-pole magnets are alternately arranged at predetermined intervals in the transfer direction of the carrier 6. The magnetic screw 27 is a cylindrical member having a central axis parallel to the transfer direction of the carrier 6. N- and S-pole spiral portions are alternately spirally arranged on the surface of the magnetic screw 27. In the direction parallel to the central axis of the magnetic screw 27, the pitch of the N- and S-pole spiral portions matches that of the magnet group 17, and the magnetic screw 27 is set with a predetermined spacing from the magnet group 17.

When the magnetic screw 27 is rotated in a predetermined direction in the above arrangement, the N- and S-pole spiral portions opposing the magnet group 17 move in the transfer direction (the direction of the arrow C) of the carrier 6 relative to the magnet group 17. Consequently, the attractive force and repulsive force between the S- and N-pole magnets of the magnet group 17 and the N- and S-pole spiral portions of the magnetic screw 27 generate a propulsive force that moves the carrier 6 in the direction of the arrow C. This propulsive force rotates the guide rollers 22, thereby transferring the carrier 6 in the direction of the arrow C.

In this embodiment, the first magnet 15 of the carrier 6 and the second magnet 25 of the carrier supporting means 21 have opposite polarities, and the first magnet 15 below the second magnetic 25 vertically opposes it. Accordingly, the attractive force between the first and second magnets 15 and 25 acts in a direction to pull up the carrier 6, thereby reducing the weight of the carrier 6 on the guide rollers 22. Note that the carrier 6 floats if the attractive force between the first and second magnets 15 and 25 is too strong. Therefore, the attractive force is appropriately controlled by adjusting the magnetic forces and spacing of the first and second magnets 15 and 25. The transfer apparatus according to this embodiment includes a detecting means (not shown) for detecting the magnetic forces and spacing of the first and second magnets 15 and 25, and a control means (not shown) for controlling the magnetic forces and spacing of the first and second magnets 15 and 25. On the basis of the detection results from the detecting means, the control means can adjust the magnetic forces and spacing of the first and second magnets 15 and 25, thereby controlling the attractive force between them.

When the weight of the carrier 6 on the guide rollers 22 is reduced as described above, the friction between the guide rollers 22 and the surface of the groove 13a of the guide rail portion 13 reduces. This reduces the generation of particles and the friction between the guide rollers 22 and guide rail portion 13.

The first and second magnets 15 and 25 need only have opposite polarities, so magnets continuous in the transfer direction can be used. However, each of the first and second magnets 15 and 25 may also be formed by arranging a plurality of magnets at predetermined intervals in the transfer direction of the carrier 6.

Also, this embodiment takes the method using the magnetic action between the magnetic screw 27 and magnet group 17 as an example of the carrier transferring means. However, the present invention is not limited to this method. It is also possible to use a method that converts a rotating motion obtained by a rotary driving means such as a motor into a linear motion by a rack and pinion.

Note that when using the magnetic screw system as the carrier transferring means, the attractive force between the magnetic screw 27 and magnet group 17 acts. Hence, this attractive force between the magnetic screw 27 and magnet group 17 is superposed on the weight of the carrier 6. To achieve stable carrier transfer in this state, the force of pulling up the carrier 6 must be made smaller than the total sum of the weight of the carrier 6 and the attractive force between the magnetic screw 27 and magnet group 17, thereby preventing the carrier 6 from floating more than necessary.

Second Embodiment

Figure 3B:
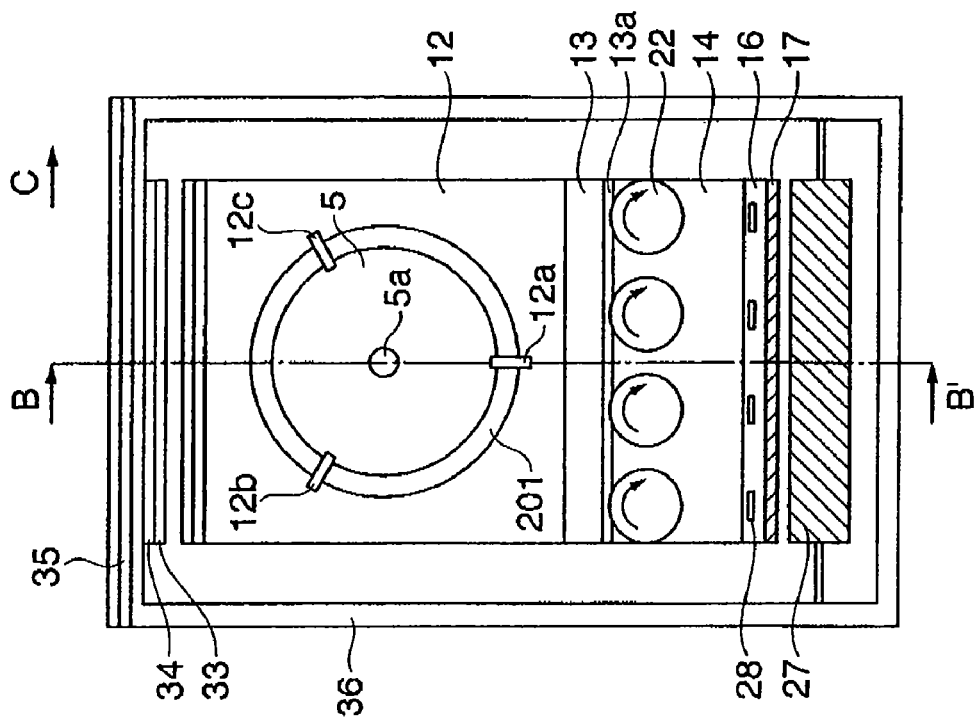
FIGS. 3A and 3B are views showing the arrangement of the main components of a transfer apparatus according to the second embodiment of the present invention.
Figure 3A:
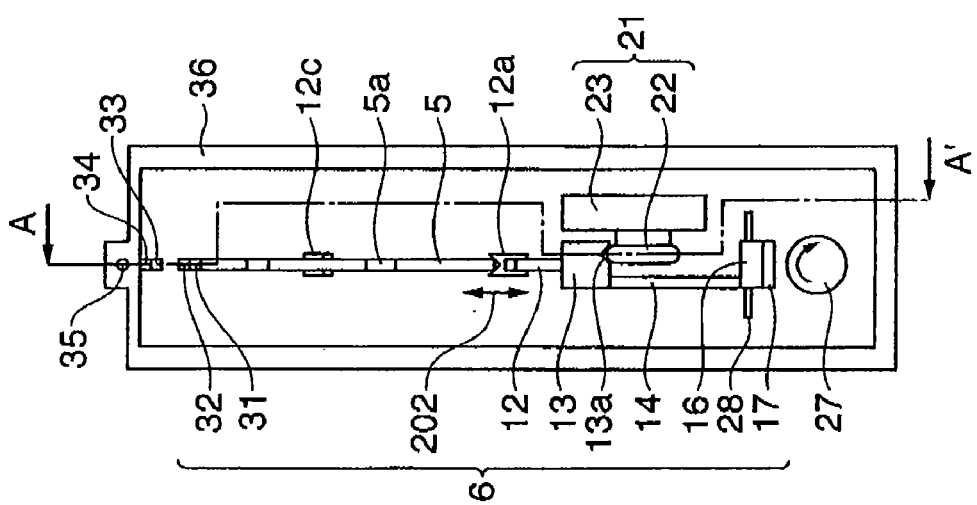

FIGS. 3A and 3B are views exemplarily showing the arrangement of the major components of a transfer apparatus according to the second embodiment of the present invention. FIG. 3A is a B-B' sectional view of FIG. 3B. FIG. 3B is an A-A' sectional view of FIG. 3A. Note that some members are not illustrated for convenience.

This embodiment is an example in which the combination of the first and second magnets 15 and 25 in the transfer apparatus shown in FIGS. 2A and 2B is placed in a portion where a carrier 6 and the inner surface of the upper wall of a vacuum chamber oppose each other. The rest of the arrangement except for the magnet positions is the same as that of the transfer apparatus shown in FIGS. 2A and 2B, so a repetitive explanation will be omitted.

In this embodiment, a first magnet 32 is placed on a magnetic yoke 31 in the upper end portion of the carrier 6 so as to vertically face up. In that portion of the inner surface of the upper wall of a vacuum chamber 36, which opposes the upper end portion of the carrier 6, a second magnet 33 is placed on a magnetic yoke 34 so as to vertically face down. The first and second magnets 32 and 33 have opposite polarities, and are arranged at a desired spacing. The action of the first and second magnets 32 and 33 is the same as that of the first and second magnets 15 and 25 in the transfer apparatus shown in FIGS. 2A and 2B. That is, the attractive force between the first and second magnets 32 and 33 acts in a direction to pull up the carrier 6, thereby reducing the weight of the carrier 6 on guide rollers 22. The magnetic yoke 31 fixes the first magnet 32, and also suppresses the leakage of a magnetic field toward a substrate 5, thereby forming a stable magnetic field.

Note that in this embodiment, a cooling means 35 using a cooling medium is formed in the upper wall of the vacuum chamber 36. This makes it possible to suppress demagnetization when the second magnet 33 is heated by thermal radiation from a plasma space around the substrate 5.

Third Embodiment

As described above, the present invention is characterized by reducing the weight of the carrier 6 on the guide rollers 22 by using the attractive force of the magnets. This attractive force can be obtained not only by the use of a pair of magnets as described above, but also by a combination of a magnet and magnetic material. That is, one is a magnet, and the other is a fixed plate made of a magnetic material. FIGS. 4A and 4B illustrate an outline of the arrangement of a transfer apparatus according to the third embodiment of the present invention.

In this example shown in FIGS. 4A and 4B, the first magnet 15 of the transfer apparatus shown in FIGS. 2A and 2B is directly used, and the second magnet 25 is replaced with a fixed plate 51 made of a magnetic material. The fixed plate 51 made of a magnetic material generates an attractive force between the fixed plate 51 and first magnet 15. When the fixed plate 51 like this is used, the fixed plate 51 has the function of the magnetic yoke 24 shown in FIGS. 2A and 2B as well. This makes the magnetic yoke 24 unnecessary. In the arrangement shown in FIGS. 4A and 4B, the force of pulling up a carrier 6 is weaker than that in the transfer apparatus shown in FIGS. 2A and 2B, but the structure is simpler than that of the transfer apparatus shown in FIGS. 2A and 2B.

Another example of the combination of the first magnet and the fixed plate made of a magnetic material as in this embodiment is an arrangement in which the second magnet 25 is directly used, and a fixed plate made of a magnetic material is used instead of the first magnet 15. In this case, the fixed plate made of a magnetic material generates an attractive force between the fixed plate and second magnet 25. Furthermore, one of the first and second magnets 32 and 33 in the transfer apparatus shown in FIGS. 3A and 3B may also be changed into a fixed plate made of a magnetic material.

Note that when using the combination of the magnet and the fixed plate made of a magnetic material as shown in FIGS. 4A and 4B, the magnet preferably comprises a plurality of magnets arranged at predetermined intervals in the transfer direction of the carrier 6, and the fixed plate can be either one fixed plate or a plurality of fixed plates arranged in a position where it or they oppose all the magnets.

Fourth Embodiment

Figure 5:
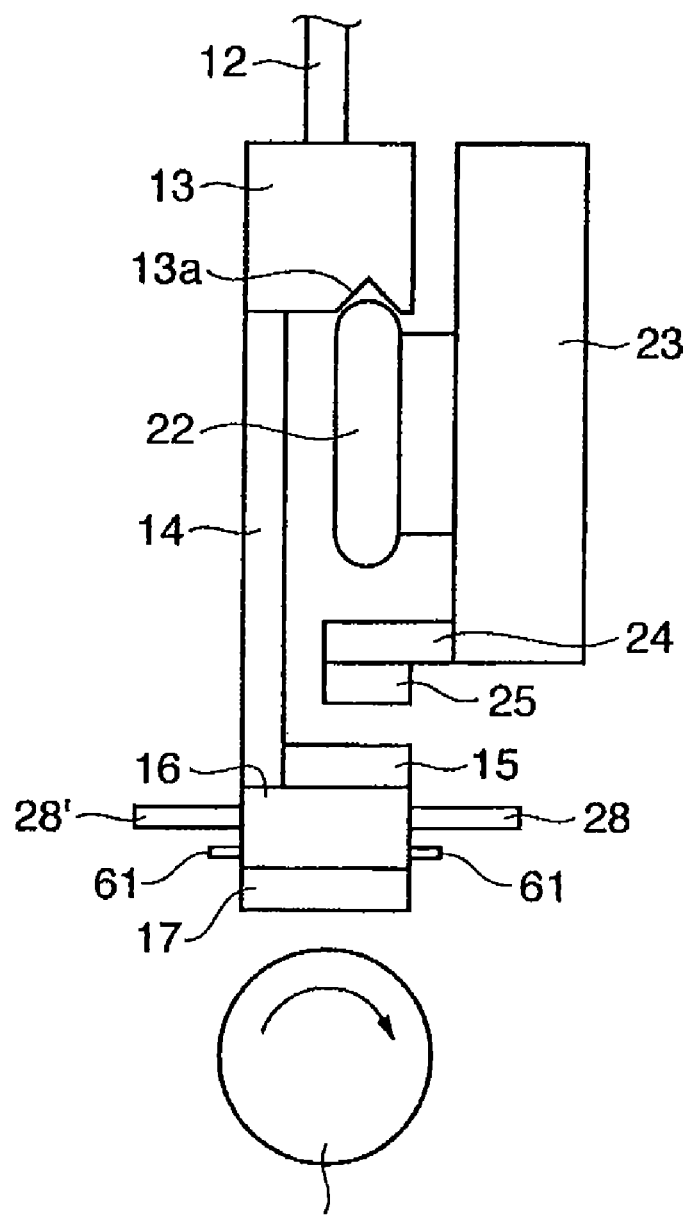
FIG. 5 is a view showing the arrangement of the main parts of a transfer apparatus according to the fourth embodiment of the present invention.

In the transfer apparatus according to each of the first to third embodiments described above, an anti-floating stopper 61 as shown in FIG. 5 is preferably attached to a carrier 6. If the carrier 6 entirely floats upward, the anti-floating stopper 61 attached to the carrier 6 also floats upward. On the other hand, guide rollers 28 rotate around the vertical axis and support the carrier 6 in a contact state, i.e., the guide rollers 28 are not integrated with the carrier 6. Therefore, even when the carrier 6 entirely floats upward, the guide rollers 28 do not float upward. In the example shown in FIG. 5, horizontal guide rollers 28 and 28' sandwiching a magnetic yoke 16 also function as stoppers for suppressing upward floating (in the y direction) of the anti-floating stopper 61. That is, the spacing between the anti-floating stopper 61 and guide rollers 28 is preset narrower than that between first and second magnets 15 and 25. Accordingly, even when the carrier 6 floats upward until the anti-floating stopper 61 comes in contact with the guide rollers 28, the first and second magnets 15 and 25 do not come in contact with each other. The anti-floating stopper 61 as described above can prevent an inconvenient operation in which the carrier 6 floats more than a predetermined amount during transfer due to, e.g., a jump of the carrier 6, thereby bringing the first and second magnets 15 and 25 into contact with each other.

Note that this embodiment uses the guide rollers 28, but the present invention is not limited to this embodiment. That is, it is only necessary to use a support member formed the above anti-floating stopper 61 and not integrated with the carrier 6.

Fifth Embodiment

FIGS. 6A and 6B are views exemplarily showing the arrangement of the major components of a transfer apparatus according to the fifth embodiment of the present invention. FIG. 6A is a B-B' sectional view of FIG. 6B. FIG. 6B is an A-A' sectional view of FIG. 6A. Note that some members such as a vacuum chamber are not illustrated for convenience.

In a carrier 6 shown in FIGS. 6A and 6B, a first magnet 15 is attached to a connecting portion 14 by using a magnetic yoke 18.

A magnetic yoke 24 fixed to a carrier supporting means 21 vertically opposes the magnetic yoke 18 attached to the carrier 6. In this opposing portion, the first magnet 15 is placed on the magnetic yoke 18 so as to vertically face down. On the magnetic yoke 24 opposing the magnetic yoke 18, a second magnet 25 having the same polarity as that of the first magnet 15 is placed to vertically face up with a predetermined spacing from the first magnet 15.

In this embodiment, the magnetic yoke 18 made of a magnetic material is placed on the substrate side of the first magnet 15 closer to the substrate 5 than the second magnet 25. The magnetic yoke 18 fixes the first magnet 15, and also suppresses the leakage of a magnetic field to the back side, thereby forming a stable magnetic field. In addition, the magnetic yoke 18 makes it possible to prevent the magnetic fields of the first and second magnets 15 and 25 from influencing a plasma space around the substrate 5, and suppress the influence of thermal radiation from the plasma space. The magnetic yoke 16 fixes the first magnet 15 and a magnet group 17, and also suppresses the leakage of the magnetic fields from a magnetic screw 27 and the magnet group 17 to the first magnet 15, thereby forming a stable magnetic field.

In this embodiment, the first magnet 15 of the carrier 6 and the second magnet 25 of the carrier supporting means 21 have the same polarity on the opposing surfaces, and the first magnet 15 above the second magnet 25 vertically opposes it. Therefore, the repulsive force between the first and second magnets 15 and 25 acts in a direction to float the carrier 6 upward, thereby reducing the weight of the carrier 6 on guide rollers 22. Note that the carrier 6 becomes unstable if the repulsive force between the first and second magnets 15 and 25 is too strong. Therefore, the repulsive force is appropriately controlled by adjusting the magnetic forces and spacing of the first and second magnets 15 and 25. The transfer apparatus according to this embodiment includes a detecting means (not shown) for detecting the magnetic forces and spacing of the first and second magnets 15 and 25, and a control means (not shown) for controlling the magnetic forces and spacing of the first and second magnets 15 and 25. On the basis of the detection results from the detecting means, the control means can adjust the magnetic forces and spacing of the first and second magnets 15 and 25, thereby controlling the repulsive force between them.

When the weight of the carrier 6 on the guide rollers 22 is reduced as described above, the friction between the guide rollers 22 and the surface of a groove 13a of a guide rail portion 13 reduces. This reduces the generation of particles and the friction between the guide rollers 22 and guide rail portion 13.

The first and second magnets 15 and 25 need only have the same polarity, so magnets continuous in the transfer direction can be used. However, each of the first and second magnets 15 and 25 may also be formed by arranging a plurality of magnets at predetermined intervals in the transfer direction of the carrier 6.

Note that when using a magnetic screw system as a carrier transferring means, the attractive force between a magnetic screw 27 and the magnet group 17 acts. Hence, this attractive force between the magnetic screw 27 and magnet group 17 is superposed on the weight of the carrier 6. To achieve stable carrier transfer in this state, the force of floating the carrier 6 upward must be made smaller than the total sum of the weight of the carrier 6 and the attractive force between the magnetic screw 27 and magnet group 17, thereby preventing the carrier 6 from floating more than necessary.

Sixth Embodiment

Figures 7A, 7B:
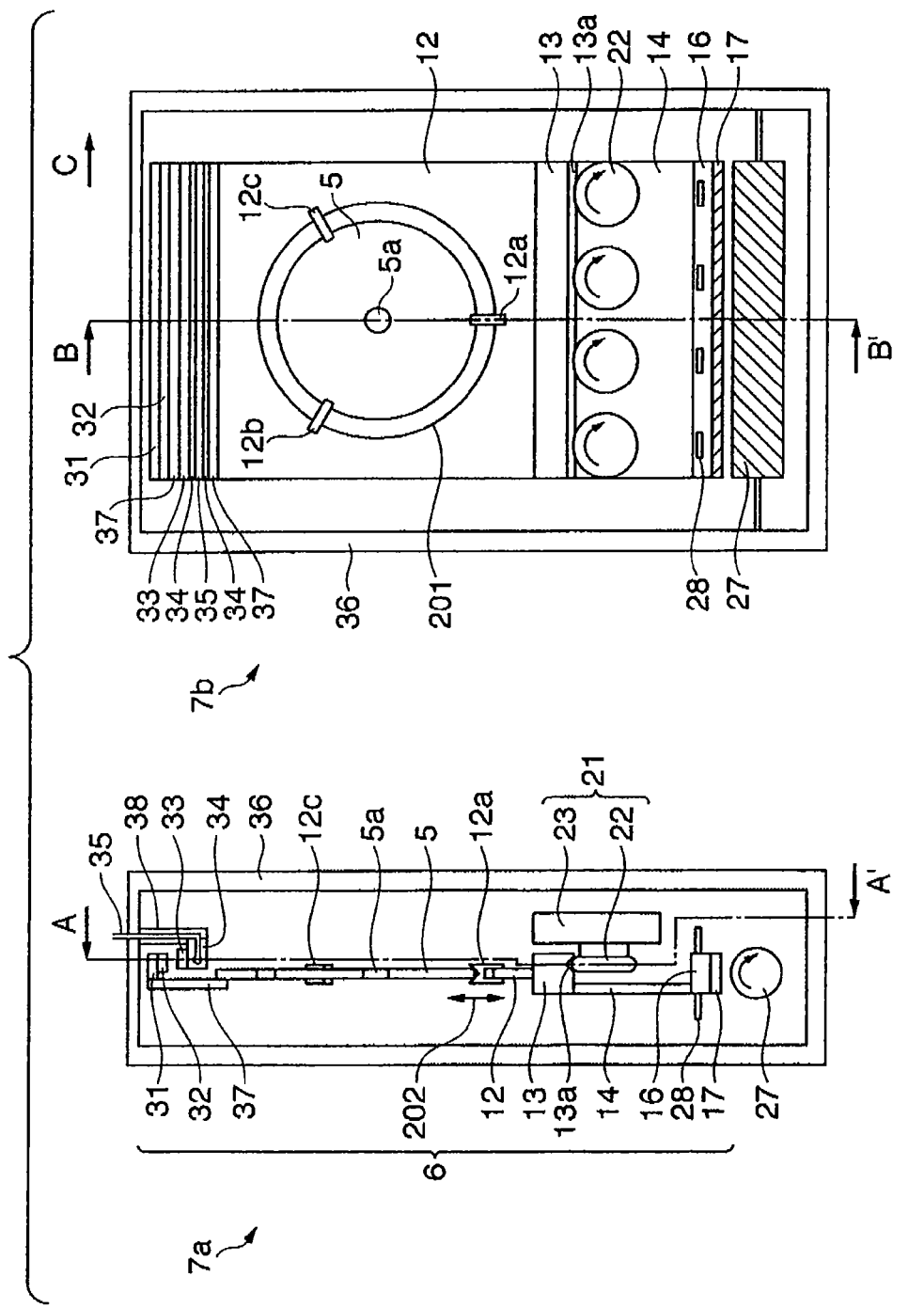
FIGS. 7A and 7B are views showing the arrangement of the main components of a transfer apparatus according to the sixth embodiment of the present invention.

FIGS. 7A and 7B are views exemplarily showing the arrangement of the main parts of a transfer apparatus according to the sixth embodiment of the present invention. FIG. 7A is a B-B' sectional view of FIG. 7B. FIG. 7B is an A-A' sectional view of FIG. 7A. Note that some members are not illustrated for convenience.

This embodiment is an example in which the combination of the first and second magnets 15 and 25 in the transfer apparatus shown in FIGS. 6A and 6B is placed in a carrier 6 and in an opposing portion formed on the upper wall of a vacuum chamber. The rest of the arrangement except for the magnet positions is the same as that of the transfer apparatus shown in FIGS. 6A and 6B, so a repetitive explanation will be omitted.

In this embodiment, a stay member 37 is attached to the upper end portion of the carrier 6, and a magnetic yoke 31 is attached to the distal end of the stay member 37. On the other hand, a stay member 38 is attached to the upper wall of a vacuum chamber 36, and a magnetic yoke 34 is attached to the distal end of the stay member 38. The magnetic yokes 31 and 34 vertically oppose each other as the magnetic yoke 31 of the carrier 6 is positioned above the magnetic yoke 34. On the opposing surfaces, a first magnet 32 is placed on the magnetic yoke 31 so as to vertically face down, and a second magnet 33 having the same polarity as that of the first magnet 32 is placed on the magnetic yoke 34 so as to vertically face up. The first and second magnets 32 and 33 are arranged with a predetermined spacing between them. The first and second magnets 32 and 33 have the same polarity, and have the same function as that of the first and second magnets 15 and 25 in the transfer apparatus shown in FIGS. 6A and 6B. That is, the repulsive force between the first and second magnets 32 and 33 functions in a direction to float the carrier 6 upward, thereby reducing the weight of the carrier 6 on guide rollers 22. The magnetic yoke 34 fixes the second magnet 33, and also suppresses the leakage of a magnetic field toward a substrate 5, thereby forming a stable magnetic field.

Note that in this embodiment, a cooling means 35 using a cooling medium is formed in the magnetic yoke 34. This makes it possible to suppress demagnetization when the magnet 33 is heated by thermal radiation from a plasma space around the substrate 5.

Seventh Embodiment

Figure 8:
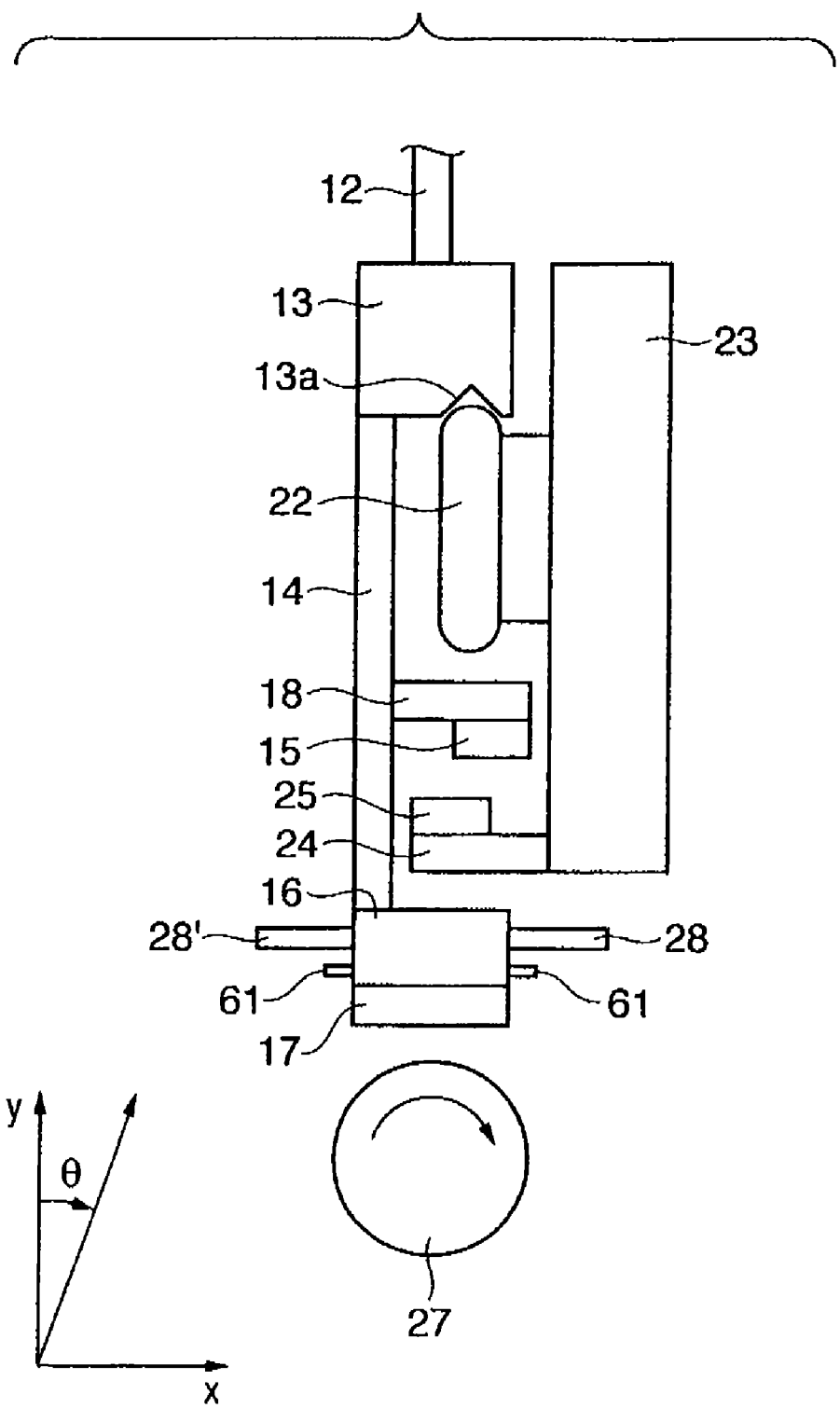
FIG. 8 is a view showing the arrangement of the major parts of a transfer apparatus according to the seventh embodiment of the present invention.

In the transfer apparatus according to each of the fifth and sixth embodiments described above, an anti-floating stopper 61 as shown in FIG. 8 is preferably attached to a carrier 6. If the carrier 6 entirely floats upward, the anti-floating stopper 61 attached to the carrier 6 also floats upward. In the example shown in FIG. 8, horizontal guide rollers 28 and 28' sandwiching a magnetic yoke 16 also function as stoppers for suppressing upward floating (in the y direction) of the anti-floating stopper 61. The anti-floating stopper 61 as described above can prevent the carrier 6 from floating more than a predetermined amount during transfer due to, e.g., a jump of the carrier 6.

Also, in each of the fifth to seventh embodiments, the repulsive force between the first magnet 15 or 32 and second magnet 25 or 33 functions in a direction (the vertical direction (y direction)) to float the carrier 6, and also functions in a direction to move the opposing magnet in the horizontal direction (x direction). When the carrier 6 is moved in the horizontal direction (x direction) by the repulsive force, the guide rollers 28 or 28' are positioned in the direction of the movement. By bringing the carrier 6 in contact with the guide rollers 28 or 28', therefore, the position of the carrier 6 in the horizontal direction (x direction) can be determined in accordance with the position of the guide rollers. This makes stable transfer of the carrier 6 feasible. Note that in this case, the guide rollers 28' opposing the guide rollers 28 and the carrier 6 need not be in contact with each other, and a spacing of a few mm may also be formed. If rolling or the like of the carrier 6 occurs, the guide rollers 28' function as stoppers for preventing the carrier 6 from inclining in the θ direction.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-219564 filed Aug. 27, 2007 and Japanese Patent Application No. 2007-219565 filed Aug. 27, 2007, which are hereby incorporated by reference herein in their entirety.

What is claimed is:

1. A transfer apparatus including a carrier which supports a major surface of a substrate parallel to a transfer direction of the substrate, carrier supporting means fixed in a vacuum chamber to support a weight of said carrier such that said carrier is slidable in the transfer direction, and carrier transferring means for transferring said carrier in the transfer direction in the vacuum chamber, the transfer apparatus comprising:

a first magnetic member placed in said carrier; and a second magnetic member placed in said carrier supporting means to oppose said first magnetic member from a position above said first magnetic member in the vertical direction, and having a polarity opposite to that of said first magnetic member.

2. The apparatus according to claim 1, wherein an attractive force generated between said first magnetic member and said second magnetic member vertically pulls up said carrier, thereby reducing the load on said carrier supporting means from the weight of said carrier.

3. A transfer apparatus including a carrier which supports a major surface of a substrate parallel to a transfer direction of the substrate, carrier supporting means fixed in a vacuum chamber to support a weight of said carrier such that said carrier is slidable in the transfer direction, and carrier transferring means for transferring said carrier in the transfer direction in the vacuum chamber, the transfer apparatus comprising:

a first magnetic member placed on an upper end portion of said carrier; and a second magnetic member placed on an inner surface of an upper wall of the vacuum chamber to oppose said first magnetic member from a position above said first magnetic member in the vertical direction, and having a polarity opposite to that of said first magnetic member.

4. The apparatus according to claim 3, wherein an attractive force generated between said first magnetic member and said second magnetic member vertically pulls up said carrier, thereby reducing the load on said carrier supporting means from the weight of said carrier.

5. The apparatus according to claim 1, wherein said second magnetic member is placed on a magnetic yoke made of a magnetic material in said carrier supporting means.

6. The apparatus according to claim 3, wherein said first magnetic member is placed on a magnetic yoke made of a magnetic material in said carrier.

7. The apparatus according to claim 1, further comprising an anti-floating stopper which prevents said carrier from floating more than a predetermined amount during transfer.

8. The apparatus according to claim 3, further comprising an anti-floating stopper which prevents said carrier from floating more than a predetermined amount during transfer.

9. A transfer apparatus including a carrier which supports a major surface of a substrate parallel to a transfer direction of the substrate, carrier supporting means fixed in a vacuum chamber to support a weight of said carrier such that said carrier is slidable in the transfer direction, and carrier transferring means for transferring said carrier in the transfer direction in the vacuum chamber, the transfer apparatus comprising:

a first magnetic member placed in said carrier; and a second magnetic member placed in said carrier supporting means to oppose said first magnetic member from a position below said first magnetic member in the vertical direction, and having a same polarity as that of said first magnetic member.

10. The apparatus according to claim 9, wherein a repulsive force generated between said first magnetic member and said second magnetic member vertically pushes up said carrier, thereby reducing the load on said carrier supporting means from the weight of said carrier.

11. A transfer apparatus including a carrier which supports a major surface of a substrate parallel to a transfer direction of the substrate, carrier supporting means fixed in a vacuum chamber to support a weight of said carrier such that said carrier is slidable in the transfer direction, and carrier transferring means for transferring said carrier in the transfer direction in the vacuum chamber, the transfer apparatus comprising:

a first magnetic member placed on an upper end portion of said carrier; and a second magnetic member placed on an inner surface of an upper wall of the vacuum chamber to oppose said first magnetic member from a position below said first magnetic member in the vertical direction, and having a same polarity as that of said first magnetic member.

12. The apparatus according to claim 11, wherein a repulsive force generated between said first magnetic member and said second magnetic member vertically pushes up said carrier, thereby reducing the load on said carrier supporting means from weight of said carrier.

13. The apparatus according to claim 9, wherein said first magnetic member is placed on a magnetic yoke made of a magnetic material in said carrier supporting means.

14. The apparatus according to claim 11, wherein said second magnetic member is placed on a magnetic yoke made of a magnetic material in said carrier.

15. The apparatus according to claim 9, further comprising an anti-floating stopper which prevents said carrier from floating more than a predetermined amount during transfer.

16. The apparatus according to claim 11, further comprising an anti-floating stopper which prevents said carrier from floating more than a predetermined amount during transfer.

* * * * *